(12) United States Patent
Suyama et al.

(10) Patent No.: US 10,389,318 B2
(45) Date of Patent: Aug. 20, 2019

(54) AUDIO SYSTEM, AUDIO DEVICE, CONTROL TERMINAL DEVICE, CONTROL METHOD, AND PARAMETER CONTROL DEVICE

(71) Applicant: YAMAHA CORPORATION, Hamamatsu-shi (JP)

(72) Inventors: Akihiko Suyama, Hamamatsu (JP); Tomoyoshi Akutagawa, Hamamatsu (JP); Keisuke Tsukada, Hamamatsu (JP)

(73) Assignee: YAMAHA CORPORATION, Hamamatsu-Shi (JP)

( * ) Notice: Subject to any disclaimer, the term of this patent is extended or adjusted under 35 U.S.C. 154(b) by 0 days.

(21) Appl. No.: 15/815,865

(22) Filed: Nov. 17, 2017

(65) Prior Publication Data

US 2018/0091106 A1    Mar. 29, 2018

Related U.S. Application Data

(63) Continuation of application No. PCT/JP2016/074202, filed on Aug. 19, 2016.

(30) Foreign Application Priority Data

Aug. 19, 2015   (JP) .................................. 2015-162331

(51) Int. Cl.
*H03G 3/30*       (2006.01)
*G06F 3/16*       (2006.01)
(Continued)

(52) U.S. Cl.
CPC ........... *H03G 3/3005* (2013.01); *G06F 3/165* (2013.01); *G08C 17/02* (2013.01); *H03G 3/02* (2013.01);
(Continued)

(58) Field of Classification Search
None
See application file for complete search history.

(56) References Cited

U.S. PATENT DOCUMENTS

| | | | | |
|---|---|---|---|---|
| 2001/0055400 | A1* | 12/2001 | Lubbe | H03G 7/002 381/106 |
| 2005/0047613 | A1* | 3/2005 | Mallinson | H03G 7/007 381/106 |

(Continued)

FOREIGN PATENT DOCUMENTS

| | | | |
|---|---|---|---|
| JP | H10149274 | A | 6/1998 |
| JP | H11154999 | A | 6/1999 |

(Continued)

OTHER PUBLICATIONS

English translation of Written Opinion issued in Intl. Appln. No. PCT/JP2016/074202 dated Nov. 1, 2016, previously cited in IDS filed Nov. 17, 2017.

(Continued)

*Primary Examiner* — Qin Zhu
(74) *Attorney, Agent, or Firm* — Rossi, Kimms & McDowell LLP

(57) ABSTRACT

An audio system includes a first audio device and a second audio device. The first audio device receives an operation of increasing or reducing a parameter value, controls a first parameter using control amount according to operation amount, calculates a ratio of change in the control amount relative to a whole parameter adjustment range, and transmits the ratio of change to the second audio device. The second audio device receives the ratio of change, converts the ratio of change into a control amount of whole parameter adjustment range, controls a second parameter using a value of an integer part of the control amount, integrates the value of the fractional part of the control amount in a storage unit, (Continued)

and controls the second parameter using the value of the integer part when integer part is generated in the integrated value of the storage unit.

16 Claims, 6 Drawing Sheets

(51) Int. Cl.
| | | |
|---|---|---|
| *H03G 3/02* | (2006.01) | |
| *G08C 17/02* | (2006.01) | |
| *H04R 3/00* | (2006.01) | |
| *H04R 27/00* | (2006.01) | |

(52) U.S. Cl.
CPC ........... *H04R 3/00* (2013.01); *G08C 2201/93* (2013.01); *H04R 27/00* (2013.01); *H04R 2227/003* (2013.01); *H04R 2227/005* (2013.01); *H04R 2430/01* (2013.01)

(56) References Cited

U.S. PATENT DOCUMENTS

| | | |
|---|---|---|
| 2009/0169030 A1 | 7/2009 | Inohara |
| 2011/0142245 A1 | 6/2011 | Toba et al. |
| 2012/0057725 A1* | 3/2012 | Nakamura ............. H04H 60/04 381/104 |
| 2015/0086042 A1* | 3/2015 | Ito ........................ G06F 3/165 381/109 |
| 2015/0148027 A1 | 5/2015 | Fukuda et al. |
| 2016/0036962 A1* | 2/2016 | Rand .................... H04R 1/1041 455/418 |
| 2016/0291925 A1 | 10/2016 | Kohara et al. |

FOREIGN PATENT DOCUMENTS

| | | |
|---|---|---|
| JP | 2005311768 A | 11/2005 |
| JP | 2009159477 A | 7/2009 |
| JP | 2011124925 A | 6/2011 |
| JP | 2015100085 A | 5/2015 |
| JP | 2015103920 A | 6/2015 |

OTHER PUBLICATIONS

International Search Report issued in Intl. Appln. No. PCT/JP2016/074202 dated Nov. 1, 2016. English translation provided.

Written Opinion issued in Intl. Appln. No. PCT/JP2016/074202 dated Nov. 1, 2016.

Office Action issued in Japanese Appln. No. 2015-162331 dated Jun. 12, 2019. English machine translation provided.

* cited by examiner

AUDIO SYSTEM, AUDIO DEVICE, CONTROL TERMINAL DEVICE, CONTROL METHOD, AND PARAMETER CONTROL DEVICE

CROSS REFERENCE TO RELATED APPLICATION(S)

This application is a continuation of International Patent Application No. PCT/JP2016/074202 filed on Aug. 19, 2016 which claims the priority of Japanese Patent Application No. 2015-162331 filed on Aug. 19, 2015, the contents of which are incorporated herein by reference in its entirety.

BACKGROUND OF THE INVENTION

1. Field of the Invention

The present invention relates to an audio system, an audio device, a control terminal device, a control method, and a parameter control device which control parameters, such as volume values, of a plurality of audio devices that are connected to each other.

2. Description of the Related Art

In the related art, for example, similarly to a Digital Living Network Alliance (registered trademark, DLNA), various guidelines are established which enable a network between electronic devices such as an audio device in the home and a mobile terminal.

In a case where a plurality of audio devices are connected to the network, it is possible to simultaneously reproduce, for example, an audio source, such as music data, by the plurality of audio devices. In addition, it is possible to use a terminal device, such as a smartphone, which is connected to the network as a remote controller, and to operate the plurality of audio devices (for example, refer to JP-A-2015-100085 as Patent Literature 1).

In a case where the audio source is simultaneously reproduced by the plurality of audio devices which are connected to the network, there is a case where it is desired to evenly increase and reduce the volume values of the plurality of audio devices.

Although it is possible to normally update the volume value of each of the audio devices from a minimum value to a maximum value by a prescribed number of steps in multi-levels, there is a case where the number of steps of volume is different for each audio device. For example, there is a case where the number of steps of volume of a master device is 200 and the number of steps of volume of a slave device is 100.

In a case where the number of steps of the volume of the master device is different from the number of steps of the volume of the slave device, a method of matching a ratio of change in a volume value of the master device with a ratio of change in a volume value of the slave device is conceivable as a method of evenly changing the volume value of the master device and the volume value of the slave device. For example, in a case where the volume value of the master device is changed by 10 steps, the ratio of change in the volume value is 5% (10/200). Here, in a case where the volume value of the slave device is changed by 5 steps corresponding to 5% of the number of total steps 100, the ratio of change in the volume value of the master device is matched with the ratio of change in the volume value of the slave device, and thus it is possible to evenly change the volume value of the master device and the volume value of the slave device.

Patent Literature 1: JP-A-2015-100085

SUMMARY OF THE INVENTION

However, in the above-described method, there is a case where it is not possible to evenly change the volume value of the master device and the volume value of the slave device. For example, in a case where the volume value of the master device is changed by 1 step, the ratio of change in the volume value of the master device is 0.5% (1/200). In contrast, the number of steps corresponding to 0.5% of the number of total steps 100 of the slave device becomes 0.5 steps. Since it is necessary that the number of steps which changes the volume value is an integer, it is not possible to increase the volume value of the slave device. Therefore, for example, in a case where the user repeatedly increases the volume value of the master device by 1 step (0.5%), it is not possible to increase the volume value of the slave device and it is not possible to increase the volume value of the slave device in accordance with the increase of the volume value of the master device.

A non-limited object of the present invention is to provide an audio system, an audio device, a control terminal device, a control method, and a parameter control device which are capable of following and controlling parameters of a plurality of audio devices even in a case where the number of steps of the parameters, such as the volume values, of the plurality of audio devices which are connected to each other are different.

An audio system provided by an aspect of the present invention includes: a first audio device; and a second audio device, wherein the first audio device includes a first processor, a first communication circuit, and a first memory, wherein the second audio device includes a second processor, a second communication circuit, a storage, and a second memory, wherein instructions stored in the first memory of the first audio device causes the first processor to: receive a parameter operation of increasing or reducing a parameter value; control first parameter adjustment of the first audio device using control amount according to operation amount received by the parameter operation; calculate a ratio of change in the control amount relative to a whole parameter adjustment range of the first parameter adjustment, and transmit the ratio of change with respect to the second audio device, and wherein instructions stored in the second memory the second audio device causes the second processor to: receive the ratio of change from the first audio device; convert the ratio of change into a control amount in a whole parameter adjustment range of second parameter adjustment; control the second parameter adjustment using a value of an integer part in the control amount; integrate a value of a fractional part in the control amount in the storage; and further control the second parameter adjustment using the value of the integer part in a case where the integer part is generated in the integrated value of the storage unit, and remove the integer part from the value of the storage.

According to the aspect of the present invention, it is possible to follow and control parameters of a plurality of audio devices even in a case where the number of steps of the parameters, such as volume values, of the plurality of audio devices which are connected to each other are different.

DETAILED DESCRIPTION OF THE EXEMPLARY EMBODIMENTS

Figure 1:
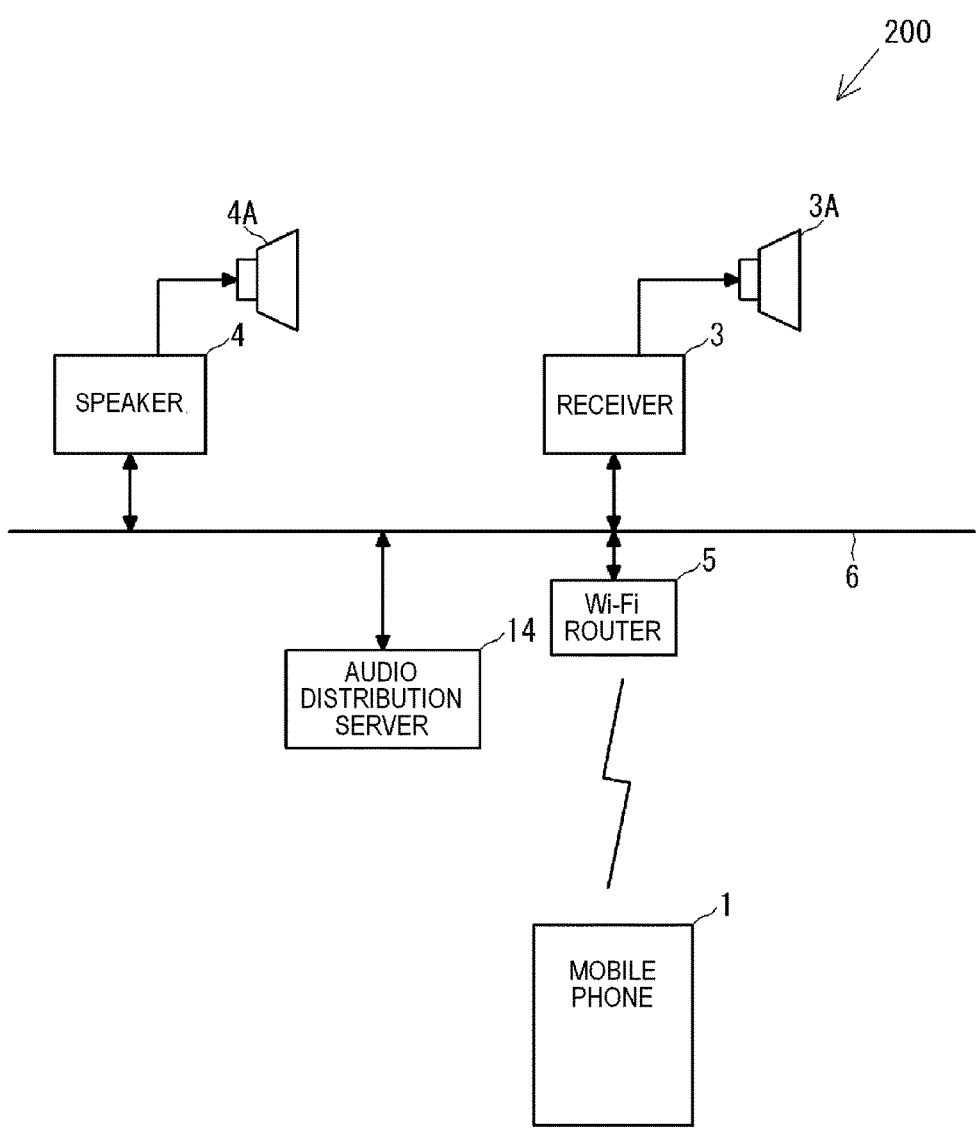
FIG. 1 is a block diagram illustrating a synchronization reproduction system which includes a mobile phone to which the present invention is applied and a plurality of audio devices.

FIG. 1 is a block diagram illustrating an example of a synchronization reproduction system 200 including a mobile phone 1, which is a terminal device to which the present invention is applied, and a plurality of audio devices 3 and 4. The synchronization reproduction system 200 includes the plurality of audio devices 3 and 4, an audio distribution server 14, and the mobile phone 1. The plurality of audio devices 3 and 4, the audio distribution server 14, and the mobile phone 1 are connected to a network 6. The network 6 is, for example, a network which mutually connects audio devices which are installed in a plurality of rooms in one building.

The synchronization reproduction system 200 constructs a synchronization reproduction group which synchronizes and reproduces the same audio source using the plurality of audio devices 3 and 4. The synchronization reproduction system 200 assigns functions of a master device and a slave device to the audio devices 3 and 4 which are connected to the network 6 in a case where the synchronization reproduction group is constructed. In the embodiment, the function of the master device is assigned to the audio device 3, and the function of the slave device is assigned to the audio device 4. Hereinafter, there are cases where the audio device 3 is referred to as a master device 3, and the audio device 4 is referred to as a slave device 4. Also, the synchronization reproduction group may be formed using three or more audio devices.

The audio distribution server 14 is a network storage which is capable of preserving and distributing an audio source such as a music source. In the audio distribution server 14, music sources or the like, which are reproduced by the audio devices 3 and 4, are preserved. The synchronization reproduction system 200 synchronizes the plurality of audio devices 3 and 4 which are connected to the network 6, and reproduces the same music data which is received from the audio distribution server 14.

The audio device 3 is a so-called receiver, and includes an audio circuit 64 (see FIG. 4) and a speaker unit 3A. The audio circuit 64 is embedded with an electronic volume circuit 64A (see FIG. 4). The audio device 4 is a network speaker, and includes an audio circuit 84 (see FIG. 5) and a speaker unit 4A. The audio circuit 84 is embedded with an electronic volume circuit 84A (see FIG. 5). The audio devices 3 and 4 are respectively connected to the network 6.

It is preferable that a type of the mobile phone 1 is a so-called smartphone. The mobile phone (smartphone) 1 has a communication function of 3G/4G which is a mobile communication network, has a communication function of wireless LAN (Wi-Fi), and is connected to the network 6 through a Wi-Fi router 5.

The mobile phone 1 functions as an audio device controller 100 (hereinafter, simply referred to as the controller 100) illustrated in FIG. 3 by activating an audio device controller program 50 (see FIG. 2. Hereinafter, simply referred to as the program 50) which is an application program (app). The controller 100 controls the audio devices 3 and 4 according to an operation of a user through the network 6. A control function includes selection of an audio source, on and off of electric power, up and down of a volume (sound volume) value, and the like. Control of the volume value in the controller 100 is performed by a tap operation and a sliding operation with respect to a slider 418 which is displayed on the controller 100. In addition, the controller 100 may transmit a command with respect to the audio device 3, and the audio device 3 may control the audio device 4.

In addition, the audio device 3 is capable of controlling volume of the audio device 4 through the network 6. That is, in a case where an operation of increasing and reducing the volume is performed using an operation panel of the audio device 3, the audio device 3 turns up and down a volume (sound volume) value of the audio device 3, and turns up and down a volume (sound volume) value of the audio device 4 through the network 6.

In the synchronization reproduction system 200, the master device 3 reproduces an audio signal which is acquired from the network 6, a cable, or the like by itself, and transmits the audio signal to the slave device 4. The slave device 4 repeatedly reproduces the audio signal. The master device 3 delays reproduction timing thereof for time which is necessary to transmit the audio signal to the slave device 4 such that reproduction in the master device 3 is synchronized with reproduction in the slave device 4. In addition, in the synchronization reproduction system 200, the volume of the master device 3 is synchronized with the volume of the slave device 4, and then controlled by the controller 100 through the network 6. In addition, the operation panel of the master device 3 is operated, the master device 3 synchronizes the sound volume of the master device 3 with the sound volume of the slave device 4, and controls the sound volume of the master device 3 and the sound volume of the slave device 4.

Figure 2:
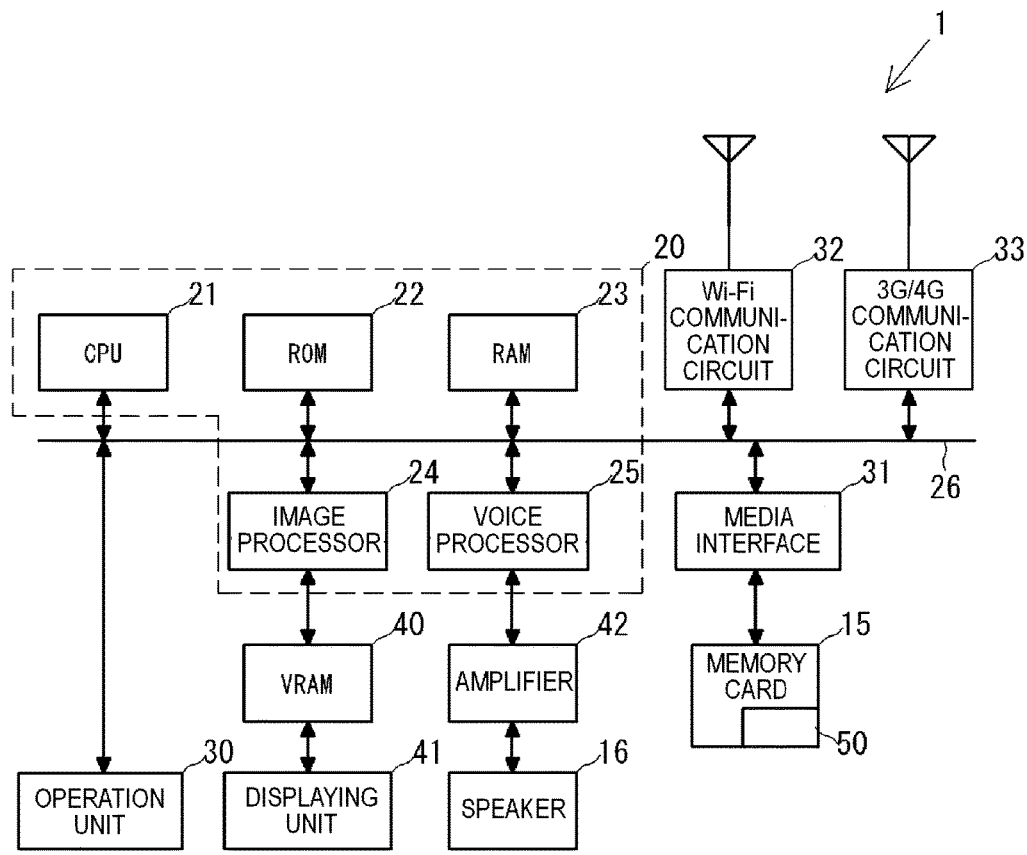
FIG. 2 is a diagram illustrating a configuration of the mobile phone which functions as an audio device controller.

FIG. 2 illustrates a configuration of the mobile phone 1 which functions as the audio device controller 100. The mobile phone 1 includes a control unit 20, an operation unit 30, a media interface 31, a Wi-Fi communication circuit 32, and a 3G/4G communication circuit 33 on a bus 26. The control unit 20 includes a CPU 21, a ROM (flash memory) 22, a RAM 23, an image processor 24, and a voice processor 25. A video RAM (VRAM) 40 is connected to the image processor 24, and a displaying unit 41 is connected to the VRAM 40. The displaying unit 41 includes a liquid crystal display, and displays a standby screen, a telephone number, or the like. In addition, a screen of the controller 100 which will be described later is displayed on the displaying unit 41. An amplifier 42, which includes a D/A converter, is connected to the voice processor 25, and a speaker 16 is connected to the amplifier 42.

The image processor 24 includes a Graphics Processing Unit (GPU) which generates various video such as the standby screen and the telephone number. In a case where the program 50 is activated, the image processor 24 generates an image of the audio device controller according to an instruction of the CPU 21, and deploys the image on the VRAM 40. The image, which is deployed on the VRAM 40, is displayed on the displaying unit 41.

The voice processor 25 includes a Digital Signal Processor (DSP) which encodes and decodes telephone voice. The voice processor 25 outputs the decoded/generated voice to the amplifier 42. The amplifier 42 amplifies a voice signal and outputs the voice signal to the speaker 16.

The Wi-Fi communication circuit 32 performs wireless communication with the Wi-Fi router 5 in conformity to IEEE802.11g standards, and transmits and receives data and messages to and from devices, such as the audio devices 3 and 4, on the network 6. The 3G/4G communication circuit 33 performs a voice call and data communication through a mobile phone communication network. The application program is downloaded through data communication. Meanwhile, the application program may not only be downloaded through 3G/4G communication but also be acquired through Wi-Fi communication or an interface such as a USB.

The operation unit 30 includes a touch panel which is formed on the displaying unit 41, and detects a touch operation, the sliding operation, or the like with respect to the touch panel. A memory card 15 is connected to the media interface 31. The memory card 15 is, for example, a micro SD card. The application program, which is downloaded from a server by the 3G/4G communication circuit 33, is preserved in the memory card 15 or the ROM 22. In the mobile phone 1, the program 50 (application program) is preserved in the memory card 15 as illustrated in FIG. 2.

The program 50 includes data, which is necessary to execute a program, in addition to a program main body. The data which is necessary to execute the program includes, for example, a command table or the like. The command table is a table in which control content with respect to the audio devices 3 and 4 is associated with a command which expresses the control content. The command table stores commands to on and off the electric power of the audio devices 3 and 4, to increase and reduce the sound volume, to select the audio source, and the like.

The ROM 22 stores a basic program for executing a telephone call and the application program of the mobile phone 1. In addition, the ROM 22 is a flash memory, and is capable of storing a downloaded application program or the like in addition to the basic program. A work area, which is used in a case where the CPU 20 executes the program 50, is set in the RAM 23. In the work area, for example, a timer area, a counter area, a flag area, and the like of various data are provided.

Figure 3:
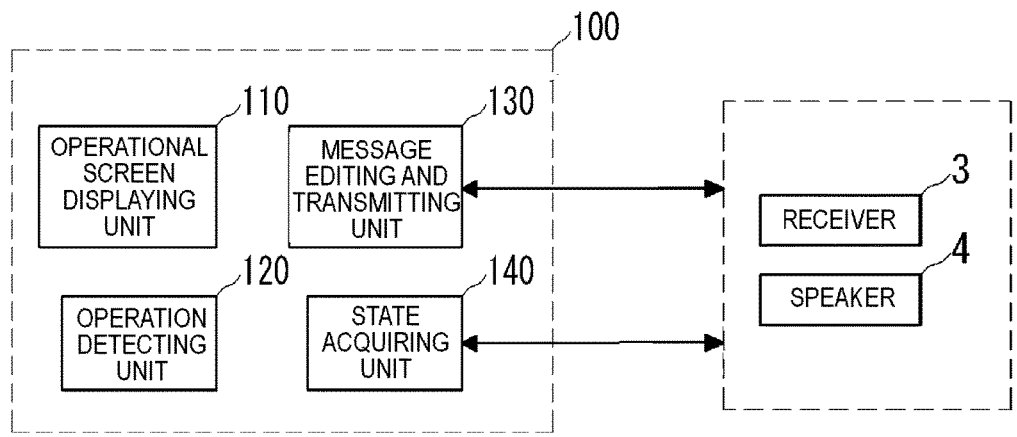
FIG. 3 is a functional block diagram illustrating an audio device controller which is formed by cooperation of the mobile phone and an audio device controller program.

FIG. 3 is a block diagram illustrating a function of the controller 100. The controller 100, which is realized in such a way that the program 50 is read into the mobile phone 1 (hardware), will be described with reference to FIG. 3. The mobile phone 1 forms the controller 100 by cooperation with the program 50 which is preserved in the memory card 15, and controls the audio devices 3 and 4 by transmitting a command message to the audio devices 3 and 4 through Wi-Fi. Meanwhile, there is a case where the audio device 4 which is the slave device is controlled by the audio device 3 which is the master device. The controller 100 includes an operational screen displaying unit 110, an operation detecting unit 120, a message editing and transmitting unit 130, and a state acquiring unit 140.

Figure 6:
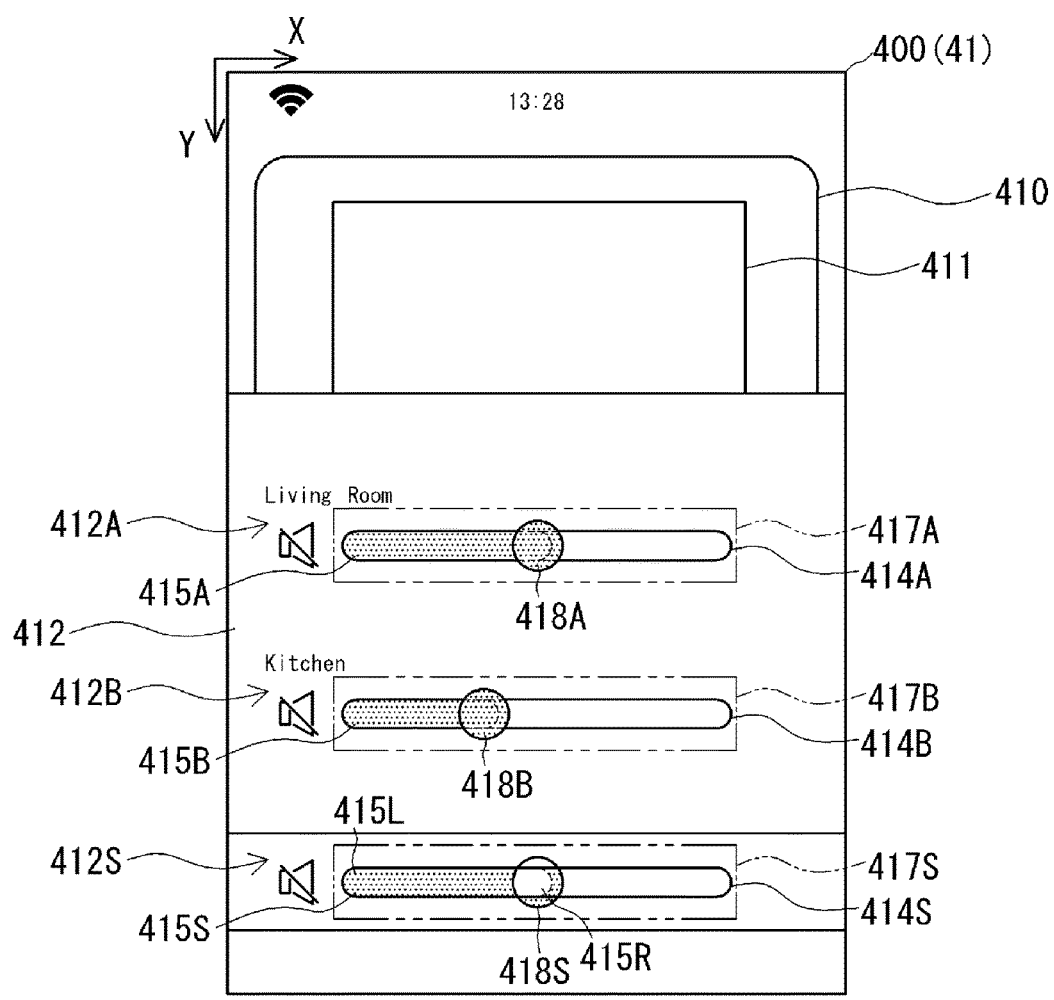
FIG. 6 is a view illustrating an example of display of a screen of the audio device controller performed by the mobile phone.

The operational screen displaying unit 110 is realized by the cooperation of the control unit 20, the VRAM 40, the displaying unit 41, and the program 50, and displays, for example, various operational screens, as illustrated in FIG. 6, on the displaying unit 41 of the mobile phone 1.

The operation detecting unit 120 is realized by the cooperation of the control unit 20, the operation unit 30, and the program 50. The operation detecting unit 120 detects, for example, an operation, such as a touch operation or the sliding operation, with respect to the operational screen which is displayed on the displaying unit 41. Operational information, which is detected by the operation detecting unit 120 is input to the operational screen displaying unit 110, the message editing and transmitting unit 130, and the like.

The message editing and transmitting unit 130 is realized by the cooperation of the control unit 20, the Wi-Fi communication circuit 32, and the program 50. The message editing and transmitting unit 130 reads a command corresponding to the operational information from the command table and edits the command message based on the operational information which is input from the operation detecting unit 120. Furthermore, the message editing and transmitting unit 130 transmits the command message to the audio devices 3 and 4.

The state acquiring unit 140 is realized by the cooperation of the control unit 20, the Wi-Fi communication circuit 32, and the program 50. The state acquiring unit 140 queries with respect the audio devices 3 and 4, and acquires operating statuses of the audio devices 3 and 4. Each of the operating statuses includes an input source, a volume value, and the like which are selected at that time. The query is performed in a case where the controller 100 is activated, in a case where the audio devices 3 and 4 are activated, or appropriately (for example, every 5 seconds, immediately after the command message is transmitted, or the like). Acquired volume values are reflected in the display of an operational screen 400 which is illustrated in FIG. 6.

Figure 4:
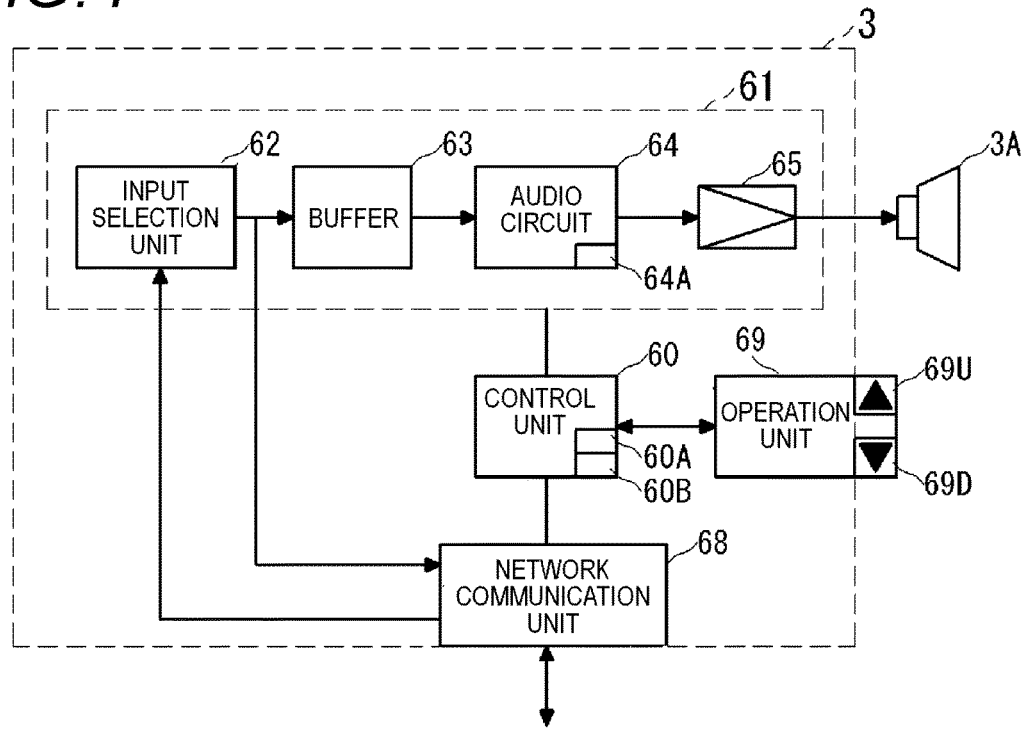
FIG. 4 is a block diagram illustrating a configuration of the audio device.
Figure 5:
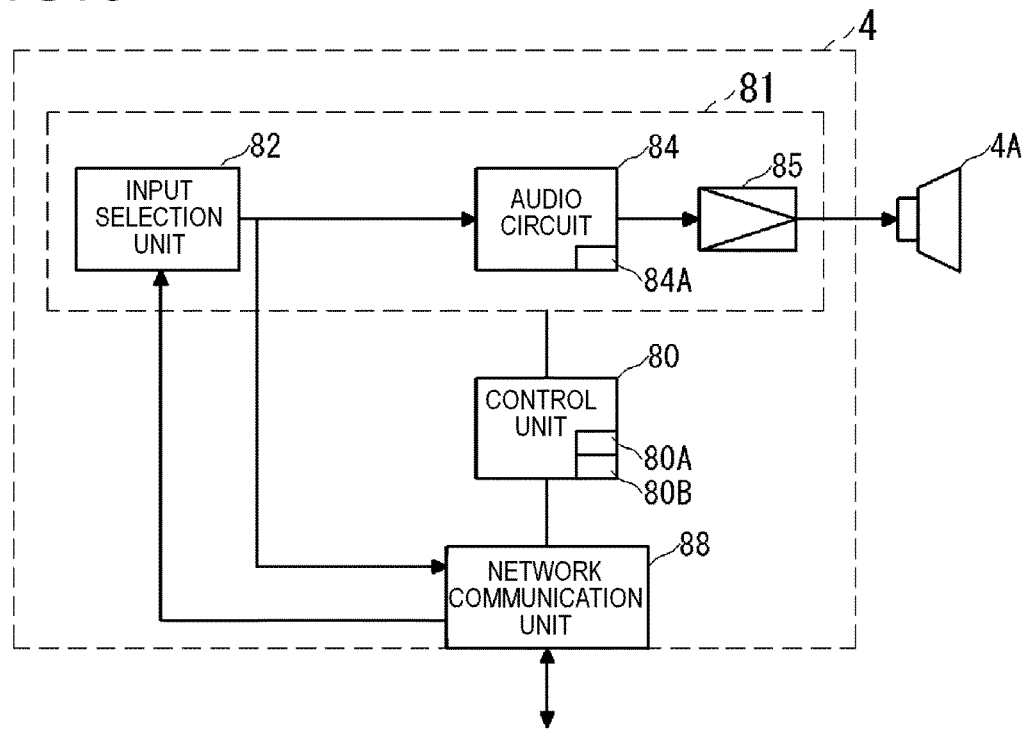
FIG. 5 is a block diagram illustrating the configuration of the audio device.

FIG. 4 is a block diagram illustrating a configuration of the audio device 3. FIG. 5 is a block diagram illustrating a configuration of the audio device 4. As illustrated in FIG. 4, the audio device 3 includes a control unit 60, an audio processing unit 61, an operation unit 69, and a network communication unit 68. The operation unit 69 includes a volume-up button 69U and a volume-down button 69D. In a case where the volume-up button 69U and the volume-down button 69D are pressed, it is possible to update the volume value of the audio device 3 in multi-levels corresponding to the number of prescribed steps from a minimum value to a maximum value. The number of steps of the volume value of the audio device 3 is, for example, 200.

The control unit 60 includes the CPU and the memory, and stores an audio system program. In addition, the control unit 60 includes a volume value storage unit 60A and a fractional value storage unit 60B. The volume value storage unit 60A stores a current volume value of the audio device 3, the number of steps (for example, 200) of the volume value of the audio device 3, and the number of virtual steps of the volume value which is common to the audio device 3 and the audio device 4. The number of virtual steps is, for example, 10,000. In a case where, volume control amount includes an integer part and a fractional part (decimal part), the fractional value storage unit 60B stores the fractional part.

The control unit 60 controls operations of the audio processing unit 61 and the network communication unit 68 by the audio system program. In addition, in a case where the volume-up button 69U or the volume-down button 69D is pressed, the control unit 60 performs an operation of increasing or reducing volume of the audio device 3 and the audio device 4. For example, in a case where the volume-up button 69U is pressed three times in succession, the volume of the audio device 3 is increased by 3 steps and a ratio (%) corresponding to the 3 steps is transmitted to the audio device 4. An operation of increasing or reducing the volume of the audio device 3 or the volume of the audio device 4 will be described in detail later.

The network communication unit 68 performs wireless communication with the Wi-Fi router 5 in conformity to wireless LAN standards, such as IEEE802.11g, and transmits and receives data and messages to and from devices, such as the audio device 4, on the network 6. The controller (mobile phone) 100 is connected to the Wi-Fi router 5, and the control unit 60 communicates with the controller 100 through the network 6, transmits the operating status, or receives the command message.

The audio processing unit 61 includes an input selection unit 62, a buffer 63, an audio circuit 64, and a power amplifier 65. The input selection unit 62 receives the audio signal from the audio distribution server 14 or LINE input, and inputs the audio signal to the audio circuit 64. The buffer 63 temporally stores the audio signal which is input from the input selection unit 62. The audio circuit 64 includes an electronic volume circuit 64A. The electronic volume circuit 64A is capable of updating the volume value of the audio device 3 in multi-levels corresponding to the number of prescribed steps (for example, 200 steps) from the minimum value to the maximum value. After the audio circuit 64 performs equalizing, sound volume adjustment processes, and the like with respect to the audio signal which is input from the buffer 63, the audio circuit 64 outputs the processed audio signal to the power amplifier 65. The power amplifier 65 amplifies the input audio signal and outputs the audio signal to an externally connected speaker 66. The speaker 66 emits the input audio signal as sound. The audio device 3 transmits the audio signal, which is selected and input by the input selection unit 62, to the audio device 4, delays the audio signal in the buffer 63 in order to synchronize with reproduction in the audio device 4, and inputs the audio signal to the audio circuit 64.

As illustrated in FIG. 5, the audio device 4 includes a control unit 80, an audio processing unit 81, and a network communication unit 88.

The control unit 80 includes the CPU and the memory, and stores an audio system program. In addition, the control unit 80 includes a volume value storage unit 80A and a fractional value storage unit 80B. The volume value storage unit 80A stores a current volume value of the audio device 4, the number of steps of the volume value of the audio device 4, and the number of virtual steps of the volume value which is common to the audio device 4 and the audio device 4. It is possible to update the volume value of the audio device 4 in multi-levels corresponding to the number of prescribed steps from the minimum value to the maximum value. The number of steps of the volume value of the audio device 4 is, for example, 100, and is different from the number of steps 200 of the volume value of the audio device 3. The number of virtual steps is the number of steps which are common to the audio device 4, and is, for example, 10,000. In a case where volume control amount includes an integer part and a fractional part (decimal part), the fractional value storage unit 80B stores the fractional part.

The control unit 80 controls operations of the audio processing unit 81 and the network communication unit 88 by the audio system program. In addition, in a case where the control unit 80 receives a command to increase or reduce volume from the audio device 3, the control unit 80 performs an operation of increasing or reducing the volume of the audio device 4. For example, in a case where the audio device 3 increases the volume of the audio device 3 by 3 steps, the audio device 3 transmits a command to increase volume at a ratio (%) corresponding to the 3 steps to the audio device 4. The audio device 4 receives the command and increases volume based on the ratio included in the command. An operation of increasing or reducing the volume of the audio device 4 and the volume of the audio device 4 will be described in detail later.

The network communication unit 88 performs wireless communication with the Wi-Fi router 5 in conformity to the wireless LAN standards, such as IEEE802.11g, and transmits and receives data and messages to and from devices, such as the audio device 3, on the network 6. The controller (mobile phone) 100 is connected to the Wi-Fi router 5, and the control unit 80 communicates with the controller 100 through the network 6, transmits the operating status, or receives the command message.

The audio processing unit 81 includes an input selection unit 82, an audio circuit 84, and a power amplifier 85. The input selection unit 82 receives the audio signal from the audio distribution server 14 or LINE input, and inputs the audio signal to the audio circuit 84. The audio circuit 84 includes an electronic volume circuit 84A. The electronic volume circuit 84A is capable of updating the volume value of the audio device 4 in multi-levels corresponding to the number of prescribed steps (for example, 100 steps) from the minimum value to the maximum value. After the audio circuit 84 performs equalizing, sound volume adjustment processes, and the like with respect to the input audio signal, the audio circuit 84 outputs the processed audio signal to the power amplifier 85. The power amplifier 85 amplifies the input audio signal and outputs the audio signal to the externally connected speaker 86. The speaker 86 emits the input audio signal as sound.

FIG. 6 is a diagram illustrating the operational screen 400 which is displayed on the controller 100 (mobile phone 1). The operational screen 400 is displayed on the displaying unit 41. In FIG. 6, a reproduction control screen 410 and a volume control screen 412 displayed on the operational screen 400. The volume control screen 412 is displayed to be superimposed on the reproduction control screen 410. The user is capable of operating the operational screen 400 using the touch panel (operation unit 30) which is superimposed on the displaying unit 41.

In the touch panel (operation unit 30), coordinate axes are set in order to grasp locations of the touch operation and the sliding operation on the displaying unit 41. In the embodiment, an upper left of the touch panel (operation unit 30) in the drawing is set to an origin, and a right side from the origin in the drawing is set to, an X axis and a downstream side from the origin in the drawing is set to a Y axis, respectively. The touch operation and the sliding operation are grasped as a change in coordinates of a location in which a finger F is in contact with the touch panel (operation unit 30). Meanwhile, in the description below, a location of a component in the displaying unit 41 will be described using a direction (up and down and right and left) of a posture illustrated in FIG. 4.

In the reproduction control screen 410, the user is capable of controlling start and stop of the selected audio source. In the reproduction control screen 410, an image 411 of the audio source which is synchronized and reproduced, and a start/stop button (not illustrated in the drawing) of the audio source is displayed.

The touch operation of each button is detected by the operation detecting unit 120, and the operational information thereof is distributed to the message editing and transmitting unit 130. For example, in a case where the reproduction button (not illustrated in the drawing) of the reproduction control screen 410 is tapped, the message editing and transmitting unit 130 transmits a reproduction start command or a stop command to the audio device 3 according to a reproduction state at that time. In addition, in a case where a fast-forwarding button (not illustrated in the drawing) is tapped, a subsequent music command or a fast-forwarding command is transmitted to the audio device 3 according to the reproduction state at that time. In addition, in a case where a rewinding button (not illustrated in the drawing) is tapped, a previous music command or a rewinding command is transmitted according to the reproduction state at that time.

In a case where the volume control of the synchronization reproduction group is performed, the volume control screen 412 is displayed to be superimposed on the reproduction control screen 410. The volume control screen 412 includes a synchronization control display area 412S and individual control display areas 412A and 412B.

In the synchronization control display area 412S, an image for performing synchronization control on volume values of the audio devices 3 and 4 which form the synchronization reproduction group is displayed. In the synchronization control display area 412S, a bar graph display area 414S, a bar graph 415S, a slider display area 417S, and a slider 418S are displayed. In a case where the slider 418S is operated, it is possible to perform synchronization control on volumes of the audio devices 3 and 4.

In the individual control display area 412A, an image for performing individual control on the volume value of the audio device 3 which forms the synchronization reproduction group is displayed. In the individual control display area 412A, bar graph display area 413, a bar graph 415A, a slider display area 417A, and a slider 418A are displayed. In a case where the slider 418A is operated, it is possible to perform individual control on the volume value of the audio device 3. In the embodiment, setting is performed such that the audio device 3 is the master device and the audio device 3 is installed in a living room.

In the individual control display area 412B, an image for performing individual control on the volume value of the audio device 4 which forms the synchronization reproduction group is displayed. In the individual control display area 412B, a bar graph display area 414, a bar graph 415B, a slider display area 417B, and a slider 418B are displayed. In a case where the slider 418B is operated, it is possible to perform individual control on the volume value of the audio device 4. In the embodiment, setting is performed such that the audio device 4 is the slave device and the audio device 4 is installed in a kitchen.

Display of the synchronization control display area 412S will be described in detail. In the bar graph display area 414S of the synchronization control display area 412S, the bar graph 415S having a length corresponding to the volume value of the current audio device 3 is displayed. The bar graph display area 414S extends in the X-axis direction.

The bar graph 415S is a graph which expresses the volume value. The bar graph 415S extends on a right side (a positive direction of the X axis) as the volume value increases while a left end of the bar graph display area 414S is used as the origin, and contracts on a left side (a negative direction of the X axis) as the volume value is reduced. The volume value is expressed by a location of a right end of the bar graph 415S. It is assumed that the left end of the bar graph 415S is a first end 415L and the right end of the bar graph 415S is a second end 415R.

The slider display area 417S covers the whole bar graph display area 414S, and the slider 418S is displayed in a location according to the volume value at that time or a user's operation.

The slider 418S is provided to increase and reduce the volume value according to the sliding operation. In FIG. 6, the slider 418S is disposed to be superimposed on the second end 415R of the bar graph 415S. It is possible to move the slider 418S to the right side and the left side along the X axis by the sliding operation performed by the user. In a case where the slider 418S is moved to the right side, the volume value is increased, and, in a case where the slider 418S is moved to the left side, the volume value is reduced. A location of the slider 418S is grasped using the coordinates. The movement amount of the slider 418S in left and right directions is grasped as displacement of an X coordinate.

In a case where the user performs the sliding operation on the slider 418S to the right side or the left side, operational information of the sliding operation is detected by the operation detecting unit 120, and is distributed to the message editing and transmitting unit 130 and the operational screen displaying unit 110. The message editing and transmitting unit 130 edits a command message to update the volume value, and transmits the command message to the audio device 3. The operational screen displaying unit 110 updates the bar graph display area 414S and display content of the slider display area 417S according to operation content.

In a case where the slider 418S is located at the left end of the bar graph display area 414S, the volume value becomes a minimum. In a case where the slider 418S is located at the right end of the bar graph display area 414S, the volume value becomes the maximum. It is possible to change the volume value between the minimum value and the maximum value in a stepwise manner. In the embodiment, it is possible to change the volume value in 200 stages (steps) from the minimum value to the maximum value in accordance with the number of steps 200 of the volume value of the audio device 3. One step of the volume value is associated with the movement amount of the slider 418S in the left and right directions, that is, displacement of the X coordinate. The volume value is changed by, for example, 0.5 dB in one step.

The individual control display areas 412A and 412B respectively correspond to the audio devices 3 and 4. In the individual control display area 412A, it is possible to change the volume value in 200 stages (steps) in accordance with the number of steps 200 of the volume value of the audio device 3. In addition, in the individual control display area 412B, it is possible to change the volume value in 100 stages (steps) in accordance with the number of steps 100 of the volume value of the audio device 4. Since display content of the other individual control display areas 412A and 412B is common to the display of the synchronization control display area 412S, the detailed description thereof will not be repeated.

Figure 7:
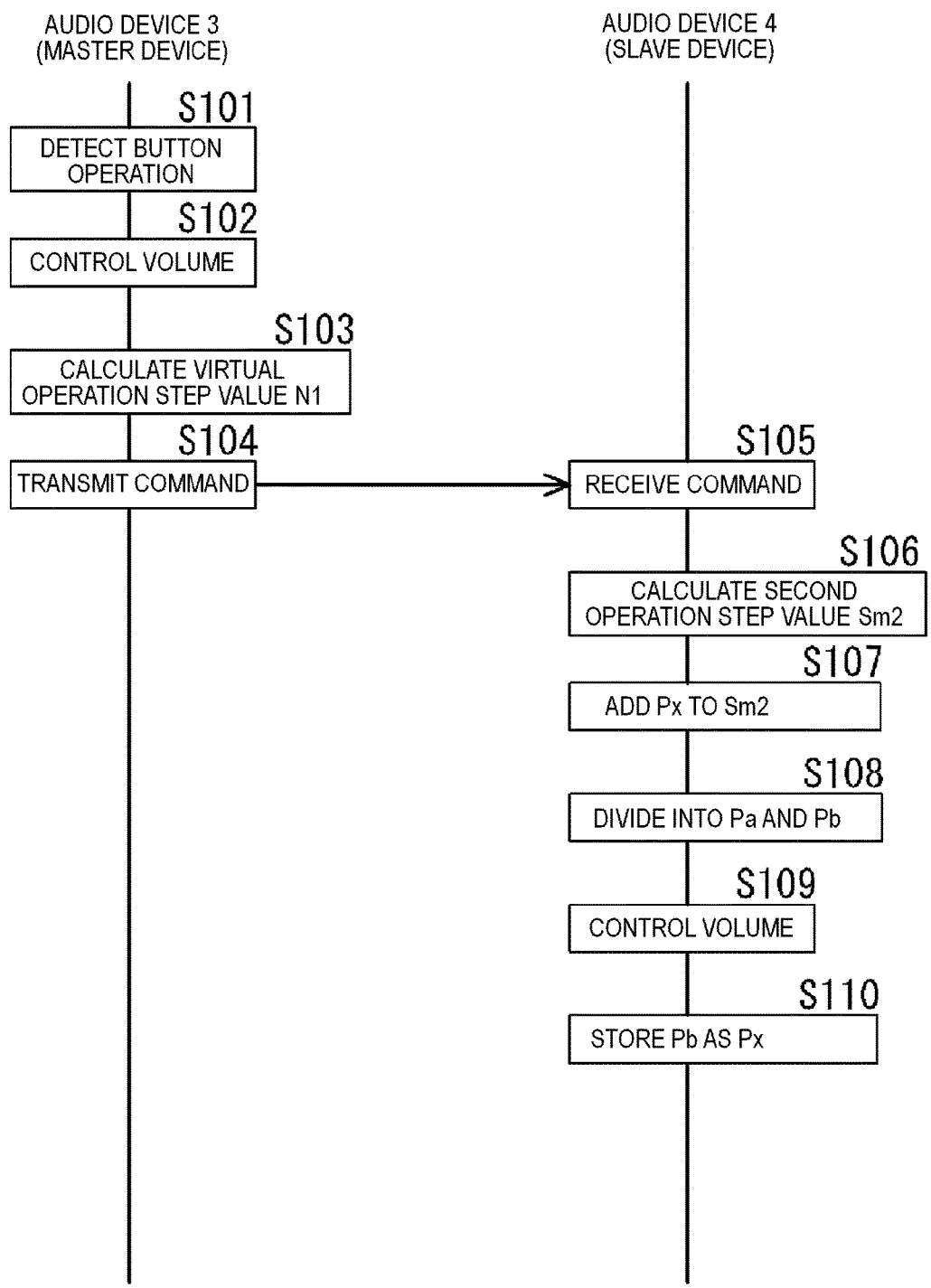
FIG. 7 is a flowchart illustrating an operation performed by the synchronization reproduction system.

Subsequently, control, in which the volume values of the audio devices 3 and 4 are evenly (synchronization) changed, will be described with reference to FIG. 7. First, control, in which the volume values of the audio devices 3 and 4 are synchronized and changed according to the operation with respect to the volume-up button 69U of the audio device 3, will be described.

First, in a case where the operation with respect to the volume-up button 69U is detected, the number of times (first operation step value Sm1), in which the volume-up button 69U is pressed in succession, is detected (S101). Here, in a case where the volume-up button 69U is pressed again in prescribed time (for example, 1 second) after being pressed immediately before, it is determined to be a succession operation. In a case where the volume-up button 69U is operated two times at intervals of the prescribed time or longer, it is determined to be respectively independent operations, and thus separate processes are performed. The control unit 60 adds the step value to a volume value register, and controls the electronic volume circuit 64A such that the volume value is acquired (S102). Meanwhile, in the description, it is assumed that the first operation step value Sm1=11 (step).

In addition, the control unit 60 calculates a virtual operation step value N1=550 using the following Equation (a) based on the first operation step value Sm1=11, the number of steps S1=200 from the maximum value to the minimum value of the volume value of the audio device 3, and the number of virtual steps Nc=10000 which are common to the audio device 3 and the audio device 4 (S103). The control unit 60 edits the virtual operation step value N2=550 in a volume control command, and transmits the virtual operation step value to the audio device 4 (S104).

$$Nc \times Sm1/S1 = N1 \qquad \text{Equation (a):}$$

The audio device 4 (network communication unit 88) receives the volume control command which is transmitted from the audio device 3 (S105). The control unit 80 of the audio device 4 calculates a second operation step value Sm2=5.5 using the following Equation (b) based on the virtual operation step value N1=550, the number of steps S2=100 from the maximum value to the minimum value of the volume value of the audio device 4, and the number of virtual steps Nc=10000 which are common to the audio device 3 and the audio device 4 (S106).

$$N1 \times S2/Nc = Sm2 \qquad \text{Equation (b):}$$

Here, in a case where there is a value (Px) which is stored in the fractional value storage unit 80B of the audio device 4, the value (Px) is added to the second operation step value Sm2=5.5 using the following Equation (c) (S107), and a resulting sum is divided into an integer part (Pa) and a decimal part (Pb) (S108). Here, it is assumed that Px=0, and the integer part Pa=5 and the decimal part Pb=0.5 are calculated.

$$Sm2 + Px = Pa + Pb \qquad \text{Equation (c):}$$

The control unit 80 of the audio device 4 regards the integer part Pa=5 as variation in the volume values of the audio device 4, and changes the volume value of the audio device 4 by 5 steps with respect to the volume value register (S109). In addition, the control unit 80 stores the decimal part Pb=0.5 as Px=0.5 in the fractional value storage unit 80B (S110).

As described above, in a case where the decimal part Pb is stored and the operation with respect to the volume-up button 69U or the volume-down button 69D of the audio device 3 is detected again, the decimal part Pb is added to the second operation step value Sm2 in S107.

Figure 8:
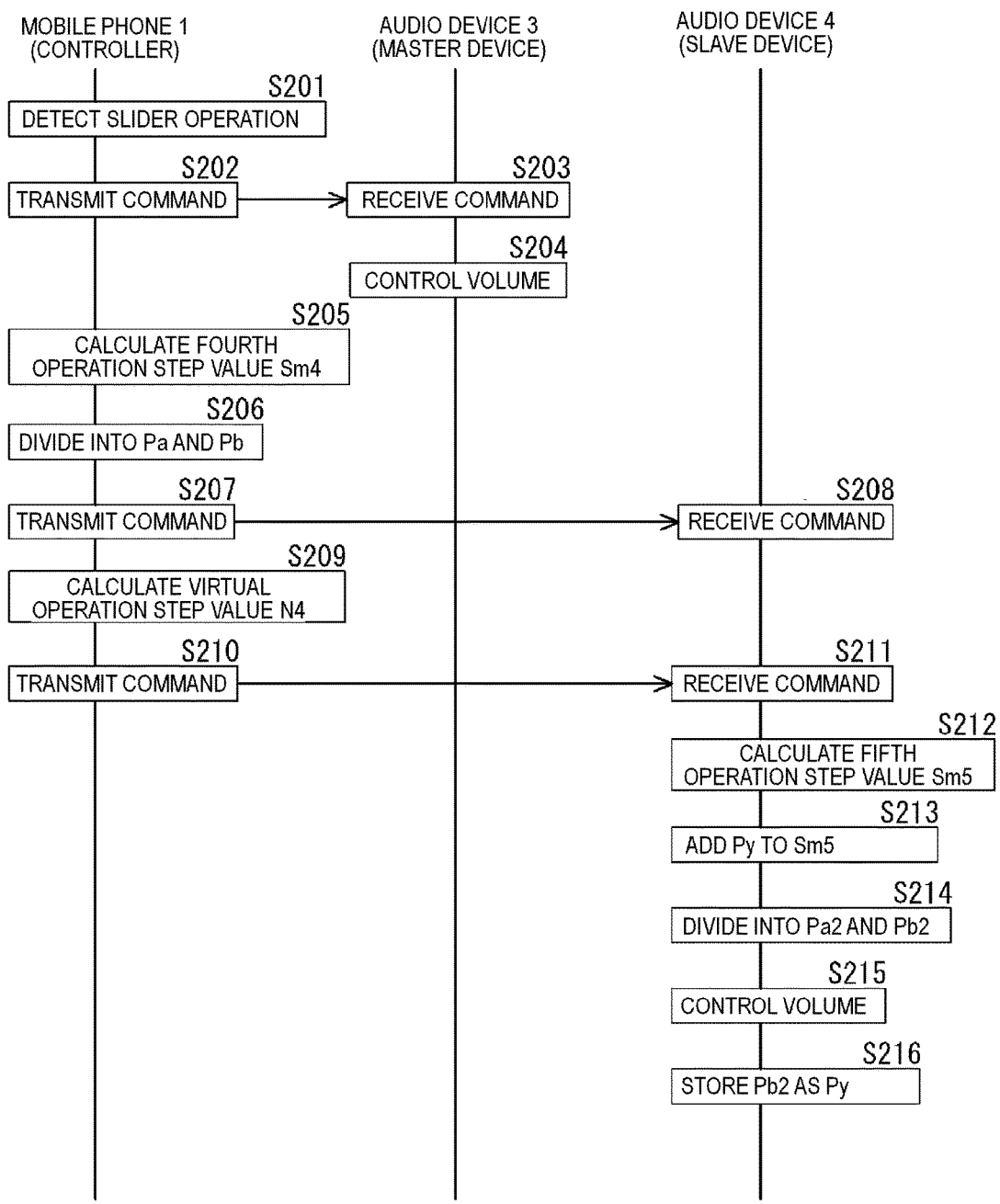
FIG. 8 is a flowchart illustrating the operation performed by the synchronization reproduction system.

Subsequently, control, in which the volume values of the audio devices 3 and 4 are synchronized and changed by the controller 100 (mobile phone 1), will be described with reference to FIG. 8.

First, in a case where an operation with respect to the slider 418S of the controller 100 (mobile phone 1) is detected, displacement (third operation step value Sm3 of the slider 418S in the left and right directions is detected (S201). In the description, it is assumed that the third operation step value Sm3=11 (steps). The message editing and transmitting unit 130 of the controller 100 (mobile phone 1) edits a command to change the volume value of the audio device 3 by 11 steps, and transmits the command to the audio device 3 (S202). The audio device 3 (network communication unit 68) receives the command (S203), and the control unit 60 of the audio device 3 controls the audio circuit 64 based on the command and changes the volume value of the audio device 3 by 11 steps (S204).

In contrast, the control unit 20 of the controller 100 (mobile phone 1) calculates a fourth operation step value Sm4=5.5 using the following Equation (a) based on the third operation step value Sm3=11, the number of steps S3=200 from the maximum value to the minimum value of the volume value of the audio device 3, and the number of virtual steps S4=100 from the maximum value to the minimum value of the volume value of the audio device 4 (S205).

$$S4 \times Sm3/S3 = Sm4 \qquad \text{Equation (a)}$$

The control unit 20 of the controller 100 (mobile phone 1) divides the fourth operation step value Sm4=5.5 into an integer part Pa1=5 and a decimal part Pb1=0.5 (S206). The message editing and transmitting unit 130 of the controller 100 (mobile phone 1) edits the integer part (Pa1=5 in the command and transmits the command to the audio device 4 (S207). The audio device 4 (network communication unit 88) receives the command which is transmitted from the audio device 3 (S208).

$$Sm4 = Pa1 + Pb1 \qquad \text{Equation (b):}$$

The control unit 20 of the controller 100 (mobile phone 1) calculates a virtual operation step value N4=50 using the Equation (c) based on the decimal part Pb1=0.5, the number of virtual steps Nc=10000 which are common to the audio device 3 and the audio device 4, and the number of steps S4=100 from the maximum value to the minimum value of the volume value of the audio device 4 (S209). The message editing and transmitting unit 130 of the controller 100 (mobile phone 1) edits the virtual operation step value N4=50 in the command and transmits the command to the audio device 4 (S210). The audio device 4 (network communication unit 88) receives the command which is transmitted from the audio device 3 (S211).

$$Nc \times Pb1/S4 = N4 \qquad \text{Equation (c):}$$

The control unit 80 of the audio device 4 calculates a fifth operation step value Sm5=0.5 using the following Equation (d) based on the virtual operation step value N4=50, the number of steps S4=100 from the maximum value to the minimum value of the volume value of the audio device 4, and the number of virtual steps Nc=10000 which is common to the audio device 3 and the audio device 4 (S212).

$$N4 \times S4/Nc = Sm5 \qquad \text{Equation (d):}$$

Here, in a case where there is a value (Py) which is stored in the fractional value storage unit 80B of the audio device 4, the value (Py) is added to the fifth operation step value Sm5=0.5 using the following Equation (e) (S213), and a resulting sum is divided into an integer part (Pa2) and a decimal part (Pb2) (S214). Here, it is assumed that Py=0, and the integer part Pa2=0 and the decimal part Pb2=0.5 are calculated.

$$Sm5+Py=Pa2+Pb2 \quad \text{Equation (e):}$$

The control unit 80 of the audio device 4 regards a sum of the integer part Pa2=5 and the integer part Pa2=0, that is, Pa3=5 as variation in the volume values of the audio device 4 using the following Equation (f). The control unit 80 changes the volume value of the audio device 4 with respect to the volume value register by 5 steps based on an integer part Pa3=5 (S215).

$$Pa1+Pa2=Pa3 \quad \text{Equation (f):}$$

The control unit 80 of the audio device 4 stores the decimal part Pb2=0.5 as Py=0.5 in the fractional value storage unit 80B (S216).

As above, in a case where the decimal part Pb2 is stored and the operation with respect to the slider 418S of the controller 100 (mobile phone 1) is detected again, the decimal part Pb2 is added to the fifth operation step value Sm5 in S213.

In the embodiment, the mobile phone 1 is provided as an example of the terminal device to which the present invention is applied. However, the terminal device is not limited to the mobile phone 1. For example, the terminal device may be a tablet or a dedicated controller terminal device.

The operation unit is not limited to the slider and the up and down buttons. Although only a relative value is not transmitted, there may be a case where an absolute value is transmitted. In the embodiment, a case where the volume is increased is provided as an example. However, in a case where the volume is reduced is the same since the value is changed into a minus value.

In the embodiment, the volume value is provided as an example. However, as long as a parameter which follows or individually increased or reduced, any type of another parameter can be applied.

An audio system provided by a first aspect of the present invention is characterized by including: a first audio device; and a second audio device, wherein the first audio device includes a first communication unit, a parameter operation unit, a first parameter adjustment unit, and a first control unit, wherein the second audio device includes a second communication unit, a storage unit, a second parameter adjustment unit, and a second control unit, wherein the parameter operation unit of the first audio device receives an operation of increasing or reducing a parameter value, wherein the first control unit of the first audio device controls the first parameter adjustment unit using control amount according to operation amount received by the parameter operation unit, calculates a ratio of change in the control amount relative to a whole parameter adjustment range of the first parameter adjustment unit, and transmits the ratio of change with respect to the second audio device, and wherein the second control unit of the second audio device receives the ratio of change from the first audio device, converts the ratio of change into a control amount in a whole parameter adjustment range of the second parameter adjustment unit, controls the second parameter adjustment unit using a value of an integer part in the control amount, integrates a value of a fractional part in the control amount in the storage unit, and further controls the second parameter adjustment unit using the value of the integer part in a case where the integer part is generated in the integrated value of the storage unit, and removes the integer part from the value of the storage unit (a first configuration).

An audio device provided by a second aspect of the present invention is characterized by including: a communication unit that communicates with another audio device; a parameter operation unit that receives an operation of increasing or reducing a parameter value; a parameter adjustment unit that adjusts a parameter of an audio signal to be output; and a control unit that controls the parameter adjustment unit using control amount according to operation amount received by the parameter operation unit, calculates a ratio of change in the control amount relative to a whole parameter adjustment range of the parameter adjustment unit, and transmits the ratio of change with respect to the another audio device (a second configuration).

An audio device is characterized by including: a communication unit that communicates with another audio device; a storage unit that stores a fractional part of a parameter value; a parameter adjustment unit that adjusts a parameter of an audio signal to be output; and a control unit that receives a ratio of change of the parameter value from the another audio device, converts the ratio of change into control amount relative to a whole parameter adjustment range of the parameter adjustment unit, controls the parameter adjustment unit using a value of an integer part in the control amount, integrates a value of a fractional part in the control amount in the storage unit, further controls the parameter adjustment unit using the value of the integer part in a case where the integer part is generated in the integrated value of the storage unit, and removes the integer part from the value of the storage unit (a third configuration).

A control terminal device provided by a third aspect of the present invention is a control terminal device which controls a parameter of an audio device, the control terminal device including: a parameter operation unit that receives an operation of increasing or reducing a parameter value; and a control unit that converts operation amount which is received by the parameter operation unit into control amount in a whole parameter adjustment range of the audio device, and transmits a value of an integer part and a value of a fractional part of the control amount to the audio device as separate messages (a fourth configuration).

The above invention may be configured such that control amounts of a plurality of audio devices in which the numbers of steps of the whole parameter adjustment range are different from each other, are calculated, and the messages are transmitted (a fifth configuration).

An audio device is characterized by including: a communication unit that communicates with a control terminal device; a storage unit that stores a fractional part of a parameter value; a parameter adjustment unit that adjusts a parameter of an audio signal to be output; and a control unit that receives a message which includes a value of an integer part and a value of a fractional part of control amount from the control terminal device, controls the parameter adjustment unit using the value of the integer part of the received control amount, integrates the value of the fractional part of the control amount in the storage unit, further controls the parameter adjustment unit using the value of the integer part in a case where the integer part is generated in the integrated value of the storage unit, and removes the integer part from the value of the storage unit (a sixth configuration).

An audio system is characterized by including: the control terminal device according to the fourth or fifth configuration; and one or more audio devices according to the sixth configuration (a seventh configuration).

A control method provided by a fourth aspect of the present invention is a control method of a mobile terminal device which is provided with an operation unit, the method including: detecting an operation of increasing or reducing a parameter value with respect to the operation unit; and converting operation amount which is received by the operation unit into control amount relative to a whole parameter adjustment range of an audio device, and transmitting a value of an integer part and a value of a fractional part of the control amount to the audio device as separate messages (an eighth configuration).

The parameter value may be a volume value of an audio signal.

A parameter control device according to a fifth aspect of the present invention includes: an operation detecting unit that detects an operation of an operated portion; a first parameter updating unit that performs a parameter updating process of increasing or reducing a prescribed first parameter according to the operation of the operated portion which is detected by the operation detecting unit; and a second parameter updating unit that performs a parameter updating process of increasing or reducing a prescribed second parameter according to the parameter updating process performed on the first parameter, wherein the first parameter updating unit includes a first updating process unit that is capable of updating the first parameter in multi-levels corresponding to the number of prescribed steps from a minimum value to a maximum value, a first storage unit that stores the number of virtual steps corresponding to the number of steps of a virtual parameter which is common to the first parameter updating unit and the second parameter updating unit, and a first control unit that controls the first updating process unit according to the operation of the operated portion, calculates control amount with respect to the second parameter updating unit based on the operation of the operated portion and the number of virtual steps which is stored in the first storage unit, and sends a command which is edited based on the calculated control amount to the second parameter updating unit, wherein the second parameter updating unit includes a second updating process unit that is capable of updating the second parameter in multi-levels corresponding to the number of prescribed steps from a minimum value to a maximum value, a second storage unit that stores the number of virtual steps and stores information which is related to the command sent from the first control unit, and a second control unit that calculates control amount of the second parameter based on the command which is sent from the first control unit, the number of virtual steps which is stored in the second storage unit, and the information which is related to the command stored in the second storage unit, and controls the second updating process unit based on the calculated control amount of the second parameter, and wherein, in a case where the first parameter is updated and variation in the first parameter is a first operation step value (Sm1), where the number of steps from the minimum value to the maximum value of the first parameter: S1, the number of steps from the minimum value to the maximum value of the second parameter: S2, and the number of virtual steps corresponding to the number of steps of the virtual parameter which is common to the first parameter updating unit and the second parameter updating unit: Nc, operations are performed as follows:

(1) the first control unit calculates a virtual operation step value (N1) using Equation (a), and edits the virtual operation step value (N1) in the command and sends the command to the second parameter updating unit $$Nc \times Sm1/S1 = N1, \qquad \text{Equation (a):}$$

(2) the second parameter updating unit calculates a second operation step value (Sm2) using Equation (b) based on the virtual operation step value (N1)

$$N1 \times S2/Nc = Sm2, \qquad \text{Equation (b):}$$

(3) in a case where there is a value (Px) which is stored in the second storage unit, the value (Px) is added to the second operation step value (Sm2) using Equation (c) and a resulting sum is divided into an integer part (Pa) and a decimal part (Pb)

$$Sm2 + Px = Pa + Pb, \qquad \text{Equation (c):}$$

(4) the second control unit controls the second updating process unit while using the integer part (Pa) as the control amount of the second parameter based on a value of the integer part (Pa), and (5) the second storage unit stores the decimal part (Pb) as the value (Px) (a ninth configuration).

A parameter control device includes: an operation detecting unit that detects an operation of an operated portion; a parameter updating instruction unit that instructs a parameter updating process of increasing or reducing a prescribed third parameter and a prescribed fourth parameter according to the operation of the operated portion which is detected by the operation detecting unit; a third parameter updating unit that performs the parameter updating process of increasing or reducing the prescribed third parameter according to the instruction from the parameter updating instruction unit: and a fourth parameter updating unit that performs the parameter updating process of increasing or reducing the prescribed fourth parameter according to the instruction from the parameter updating instruction unit, wherein it is possible to respectively update the third parameter and the fourth parameter in multi-levels corresponding to the number of prescribed steps from a minimum value to a maximum value, wherein the parameter updating instruction unit includes an updating instruction storage unit that stores the number of steps of the third parameter and the fourth parameter, and the number of virtual steps corresponding to the number of steps of a virtual parameter which is common to the parameter updating instruction unit and the fourth parameter updating unit, and an updating instruction control unit that controls the third parameter updating unit according to the operation of the operated portion, calculates control amount with respect to the fourth parameter updating unit based on the operation of the operated portion and the information which is stored in the updating instruction storage unit, and sends a command which is edited based on the calculated control amount to the fourth parameter updating unit, wherein the third parameter updating unit includes a third updating process unit that is capable of updating the third parameter in multi-levels corresponding to the number of prescribed steps from a minimum value to a maximum value, and a third control unit that controls the third updating process unit based on the command which is sent from the updating instruction control unit, wherein the fourth parameter updating unit includes a fourth updating process unit that is capable of updating the fourth parameter in multi-levels corresponding to the number of prescribed steps from a minimum value to a maximum value, a fourth storage unit that stores the number of virtual steps and stores information which is related to the command sent from the updating instruction control unit, and a fourth control unit that calculates control amount of the fourth parameter based on the command which is sent from the updating instruction control unit, the number of virtual steps which is stored in the fourth storage unit, and the information which is related to the command stored in the fourth storage unit and is sent from the updating instruction control unit, and controls the fourth updating process unit based on the calculated control amount of the fourth parameter, and wherein, in a case where the third parameter is updated and variation in the third parameter is a third operation step value (Sm3), where the number of steps from the minimum value to the maximum value of the third parameter: S3, the number of steps from the minimum value to the maximum value of the fourth parameter: S4, and the number of virtual steps corresponding to the number of steps of the virtual parameter which is common to the third parameter updating unit and the fourth parameter updating unit: Nc, operations are performed as follows:

(1) the updating instruction control unit calculates the fourth operation step value (Sm4) using Equation (a)

$$S4 \times Sm3/S3 = Sm4,\qquad \text{Equation (a):}$$

(2) the updating instruction control unit divides the fourth operation step value (Sm4) into an integer part (Pa1) and a decimal part (Pb1) using Equation (b), and edits the integer part (Pa1) in the command and sends the command to the fourth parameter updating unit $$Sm4 = Pa1 + Pb1,\qquad \text{Equation (b):}$$

(3) the updating instruction control unit calculates the virtual operation step value (N4) based on the decimal part (Pb1) using Equation (c), and edits the virtual operation step value (N4) in the command and sends the command to the fourth parameter updating unit $$Nc \times Pb1/S4 = N4,\qquad \text{Equation (c):}$$

(4) the fourth parameter updating unit calculates a fifth operation step value (Sm5) based on the virtual operation step value (N4) using Equation (d)

$$N4 \times S4/Nc = Sm5,\qquad \text{Equation (d):}$$

(5) in a case where there is a value (Py) which is stored in the fourth storage unit, the value (Py) is added to the fifth operation step value (Sm5) using Equation (e), and a resulting sum is divided into an integer part (Pa2) and a decimal part (Pb2)

$$Sm5 + Py = Pa2 + Pb2,\qquad \text{Equation (e):}$$

(6) the fourth control unit regards the sum (Pa3) of the integer part (Pa1) and the integer part (Pa2) as the control amount of the fourth parameter using Equation (f), and controls the fourth updating process unit based on a value of the integral sum (Pa)

$$Pa1 + Pa2 = Pa3, \text{ and}\qquad \text{Equation (f):}$$

(7) the fourth storage unit stores the decimal part (Pb2) as the value (Py) (a tenth configuration).

Reference signs corresponding to some elements are listed below.
1: Mobile Phone
3: Audio Device (Master Device, Receiver)
4: Audio Device (Slave Device, Network Speaker Device)
41: Displaying Unit
50: Audio Device Controller Program
100: Audio Device Controller
200: Synchronization Reproduction System
418A, 418B, 418S: Slider

What is claimed is:

1. An audio system comprising:
a first audio device; and
a second audio device,
wherein the first audio device includes a first processor, a first communication circuit, and a first memory,
wherein the second audio device includes a second processor, a second communication circuit, a storage, and a second memory,
wherein instructions stored in the first memory of the first audio device cause the first processor to:
receive a parameter operation of increasing or reducing a parameter value;
control a first parameter adjustment of the first audio device using a control amount according to an operation amount received by the parameter operation;
calculate a ratio of change in the control amount for the first audio device relative to a whole parameter adjustment range of the first parameter adjustment, and
transmit the ratio of change to the second audio device, and
wherein instructions stored in the second memory of the second audio device cause the second processor to:
receive the ratio of change from the first audio device;
convert the ratio of change received from the first audio device into a control amount in a whole parameter adjustment range of a second parameter adjustment, the control amount being expressed by a first numerical value having an integer part and a fractional part;
obtain a stored fractional part value from the storage and add the stored fractional part value to the first numerical value to obtain an updated control amount expressed by a second numerical value having an integer part and a fractional part;
control the second parameter adjustment using a value of the integer part of the updated control amount; and
store a value of the fractional part of the updated control amount in the storage as the stored fractional part value.

2. The audio system according to claim 1, wherein the parameter value is a volume value of an audio signal.

3. A method implemented by a first audio device and a second audio device, the method comprising:
receiving, by the first audio device, a parameter operation of increasing or reducing a parameter value;
controlling, by the first audio device, a first parameter adjustment of the first audio device using a control amount according to an operation amount received by the parameter operation;
calculating, by the first audio device, a ratio of change in the control amount for the first audio device relative to a whole parameter adjustment range of the first parameter adjustment;
transmitting, by the first audio device, the ratio of change to the second audio device;
receiving, by the second audio device, the ratio of change from the first audio device;
converting, by the second audio device, the ratio of change received from the first audio device into a control amount in a whole parameter adjustment range of a second parameter adjustment, the control amount being expressed by a first numerical value having an integer part and a fractional part;
obtaining, by the second audio device, a stored fractional part value from a storage and adding the stored fractional part value to the first numerical value to obtain an updated control amount expressed by a second numerical value having an integer part and a fractional part;

controlling, by the second audio device, the second parameter adjustment using a value of the integer part of the updated control amount; and storing, by the second audio device, a value of the fractional part of the updated control amount in the storage as the stored fractional part value.

4. The audio device according to claim 3, wherein the parameter value is a volume value of the audio signal.

5. An audio device comprising:

a processor;

a communication circuit configured to communicate with another audio device;

a storage configured to store a fractional part value of a parameter value; and a memory storing instructions that cause the processor to:

adjust a parameter of an audio signal to be output;

receive a ratio of change of the parameter value from the another audio device;

convert the ratio of change received from the another audio device into a control amount relative to a whole parameter adjustment range, the control amount being expressed by a first numerical value having an integer part and a fractional part;

obtain the stored fractional part value from the storage and add the stored fractional part value to the first numerical value to obtain an updated control amount expressed by a second numerical value having an integer part and a fractional part;

control parameter adjustment using a value of the integer part of the updated control amount; and store a value of the fractional part of the updated control amount in the storage as the stored fractional part value.

6. The audio device according to claim 5, wherein the parameter value is a volume value of the audio signal.

7. A control terminal device which controls a parameter of an audio device, the control terminal device comprising:

a processor; and a memory storing instructions that cause the processor to:

receive a parameter operation of increasing or reducing a parameter value;

convert an operation amount which is received by the parameter operation into a control amount in a whole parameter adjustment range of the audio device, the control amount being expressed by a first numerical value having an integer part and a fractional part; and transmit a value of the integer part of the control amount in a first message to the audio device and transmit a value corresponding to a value of the fractional part of the control amount in a second message to the audio device, the first message and the second message being separate messages from each other.

8. The control terminal device according to claim 7, wherein the instructions stored in the memory cause the processor to calculate control amounts of a plurality of audio devices in which numbers of steps of the whole parameter adjustment range are different from each other, and transmit messages to the plurality of audio devices based on the calculated control amounts of the plurality of audio devices.

9. The control terminal device according to claim 7, wherein the parameter value is a volume value of an audio signal.

10. An audio device comprising:

a processor;

a communication circuit configured to communicate with a control terminal device;

a storage configured to store a fractional part value of a parameter value;

a memory storing instructions that cause the processor to:

adjust a parameter of an audio signal to be output;

receive a message which includes a value of an integer part of a control amount from the control terminal device and a message which includes a value corresponding to a value of a fractional part of the control amount from the control terminal device;

calculate an operational step value based on the value corresponding to the value of the fractional part of the control amount received from the control terminal device;

obtain the stored fractional part value from the storage and add the stored fractional part value to the calculated operation step value to obtain a sum expressed by a numerical value having an integer part and a fractional part;

control parameter adjustment using a value obtained by adding the value of the integer part of the control amount received from the control terminal device and a value of the integer part of the sum expressed by the numerical value having the integer part and the fractional part; and store a value of the fractional part of the sum expressed by the numerical value having the integer part and the fractional part in the storage as the stored fractional part value.

11. The audio device according to claim 10, wherein the parameter value is a volume value of the audio signal, and wherein the parameter adjustment adjusts a volume of the audio signal to be output.

12. An audio system comprising:

a control terminal device; and one or more audio devices;

wherein the control terminal device includes:

a processor; and a memory storing instructions that cause the processor of the control terminal device to:

receive a parameter operation of increasing or reducing a parameter value;

convert an operation amount which is received by the parameter operation into a control amount in a whole parameter adjustment range of a first audio device among the one or more audio devices, the control amount being expressed by a first numerical value having an integer part and a fractional part; and transmit a value of the integer part of the control amount in a first message to the first audio device and transmit a value corresponding to a value of the fractional part of the control amount in a second message to the first audio device, the first message and the second message being separate messages from each other, and wherein the first audio device of the one or more audio devices includes:

a processor;

a communication circuit configured to communicate with the control terminal device;

a storage configured to store a fractional part value of a parameter value; and a memory storing instructions that cause the processor of the first audio device to:

adjust a parameter of an audio signal to be output;

receive the first messages which includes the value of the integer part of the control amount and the second message which includes the value corresponding to the value of the fractional part of the control amount from the control terminal device;

calculate an operational step value based on the value corresponding to the value of the fractional part of the control amount received from the control terminal device;

obtain the stored fractional part value from the storage and add the stored fractional part value to the calculated operation step value to obtain a sum expressed by a numerical value having an integer part and a fractional part;

control parameter adjustment using a value obtained by adding the value of the integer part of the control amount received from the control terminal device and a value of the integer part of the sum expressed by the numerical value having the integer part and the fractional part; and store a value of the fractional part of the sum expressed by the numerical value having the integer part and the fractional part in the storage as the stored fractional part value.

13. A control method of a mobile terminal device which is provided with an operation unit, the method comprising:

detecting an operation of increasing or reducing a parameter value with respect to the operation unit;

converting an operation amount which is received by the operation unit into a control amount relative to a whole parameter adjustment range of an audio device, the control amount being expressed by a first numerical value having an integer part and a fractional part;

transmitting a value of the integer part of the control amount in a first message to the audio device; and transmitting a value corresponding to a value of the fractional part of the control amount in a second message to the audio device, the first message and the second message being separate messages from each other.

14. The control method according to claim 13, wherein the parameter value is a volume value of an audio signal.

15. A parameter control device comprising:

an operation detecting unit that detects an operation of an operated portion;

a first parameter updating unit that performs a parameter updating process of increasing or reducing a prescribed first parameter according to the operation of the operated portion which is detected by the operation detecting unit; and a second parameter updating unit that performs a parameter updating process of increasing or reducing a prescribed second parameter according to the parameter updating process performed on the first parameter, wherein the first parameter updating unit includes a first updating process unit that is capable of updating the first parameter in multi-levels corresponding to the number of prescribed steps from a minimum value to a maximum value, a first storage unit that stores the number of virtual steps corresponding to the number of steps of a virtual parameter which is common to the first parameter updating unit and the second parameter updating unit, and a first control unit that controls the first updating process unit according to the operation of the operated portion, calculates control amount with respect to the second parameter updating unit based on the operation of the operated portion and the number of virtual steps which is stored in the first storage unit, and sends a command which is edited based on the calculated control amount to the second parameter updating unit, wherein the second parameter updating unit includes a second updating process unit that is capable of updating the second parameter in multi-levels corresponding to the number of prescribed steps from a minimum value to a maximum value, a second storage unit that stores the number of virtual steps and stores information which is related to the command sent from the first control unit, and a second control unit that calculates control amount of the second parameter based on the command which is sent from the first control unit, the number of virtual steps which is stored in the second storage unit, and the information which is related to the command stored in the second storage unit, and controls the second updating process unit based on the calculated control amount of the second parameter, and wherein, in a case where the first parameter is updated and variation in the first parameter is a first operation step value (Sm1), where the number of steps from the minimum value to the maximum value of the first parameter: S1, the number of steps from the minimum value to the maximum value of the second parameter: S2, and the number of virtual steps corresponding to the number of steps of the virtual parameter which is common to the first parameter updating unit and the second parameter updating unit: Nc, operations are performed as follows:

(1) the first control unit calculates a virtual operation step value (N1) using Equation (a), and edits the virtual operation step value (N1) in the command and sends the command to the second parameter updating unit $$Nc \times Sm1/S1 = N1, \qquad \text{Equation (a)}$$

(2) the second parameter updating unit calculates a second operation step value (Sm2) using Equation (b) based on the virtual operation step value (N1)

$$N1 \times S2/Nc = Sm2, \qquad \text{Equation (b)}$$

(3) in a case where there is a value (Px) which is stored in the second storage unit, the value (Px) is added to the second operation step value (Sm2) using Equation (c) and a resulting sum is divided into an integer part (Pa) and a decimal part (Pb)

$$Sm2 + Px = Pa + Pb, \qquad \text{Equation (c)}$$

(4) the second control unit controls the second updating process unit while using the integer part (Pa) as the control amount of the second parameter based on a value of the integer part (Pa), and (5) the second storage unit stores the decimal part (Pb) as the value (Px).

16. A parameter control device comprising:

an operation detecting unit that detects an operation of an operated portion;

a parameter updating instruction unit that instructs a parameter updating process of increasing or reducing a prescribed third parameter and a prescribed fourth parameter according to the operation of the operated portion which is detected by the operation detecting unit;

a third parameter updating unit that performs the parameter updating process of increasing or reducing the prescribed third parameter according to the instruction from the parameter updating instruction unit; and a fourth parameter updating unit that performs the parameter updating process of increasing or reducing the prescribed fourth parameter according to the instruction from the parameter updating instruction unit, wherein it is possible to respectively update the third parameter and the fourth parameter in multi-levels corresponding to the number of prescribed steps from a minimum value to a maximum value, wherein the parameter updating instruction unit includes an updating instruction storage unit that stores the number of steps of the third parameter and the fourth parameter, and the number of virtual steps corresponding to the number of steps of a virtual parameter which is common to the parameter updating instruction unit and the fourth parameter updating unit, and an updating instruction control unit that controls the third parameter updating unit according to the operation of the operated portion, calculates control amount with respect to the fourth parameter updating unit based on the operation of the operated portion and the information which is stored in the updating instruction storage unit, and sends a command which is edited based on the calculated control amount to the fourth parameter updating unit, wherein the third parameter updating unit includes a third updating process unit that is capable of updating the third parameter in multi-levels corresponding to the number of prescribed steps from a minimum value to a maximum value, and a third control unit that controls the third updating process unit based on the command which is sent from the updating instruction control unit, wherein the fourth parameter updating unit includes a fourth updating process unit that is capable of updating the fourth parameter in multi-levels corresponding to the number of prescribed steps from a minimum value to a maximum value, a fourth storage unit that stores the number of virtual steps and stores information which is related to the command sent from the updating instruction control unit, and a fourth control unit that calculates control amount of the fourth parameter based on the command which is sent from the updating instruction control unit, the number of virtual steps which is stored in the fourth storage unit, and the information which is related to the command stored in the fourth storage unit and is sent from the updating instruction control unit, and controls the fourth updating process unit based on the calculated control amount of the fourth parameter, and wherein, in a case where the third parameter is updated and variation in the third parameter is a third operation step value ($Sm3$), where the number of steps from the minimum value to the maximum value of the third parameter: $S3$, the number of steps from the minimum value to the maximum value of the fourth parameter: $S4$, and the number of virtual steps corresponding to the number of steps of the virtual parameter which is common to the third parameter updating unit and the fourth parameter updating unit: $Nc$, operations are performed as follows:

(1) the updating instruction control unit calculates the fourth operation step value ($Sm4$) using Equation (a)

$$S4 \times Sm3/S3 = Sm4, \quad \text{Equation (a)}$$

(2) the updating instruction control unit divides the fourth operation step value ($Sm4$) into an integer part ($Pa1$) and a decimal part ($Pb1$) using Equation (b), and edits the integer part ($Pa1$) in the command and sends the command to the fourth parameter updating unit $$Sm4 = Pa1 + Pb1, \quad \text{Equation (b)}$$

(3) the updating instruction control unit calculates the virtual operation step value ($N4$) based on the decimal part ($Pb1$) using Equation (c), and edits the virtual operation step value ($N4$) in the command and sends the command to the fourth parameter updating unit $$Nc \times Pb1/S4 = N4, \quad \text{Equation (c)}$$

(4) the fourth parameter updating unit calculates a fifth operation step value ($Sm5$) based on the virtual operation step value ($N4$) using Equation (d)

$$N4 \times S4/Nc = Sm5, \quad \text{Equation (d)}$$

(5) in a case where there is a value ($Py$) which is stored in the fourth storage unit, the value ($Py$) is added to the fifth operation step value ($Sm5$) using Equation (e), and a resulting sum is divided into an integer part ($Pa2$) and a decimal part ($Pb2$)

$$Sm5 + Py = Pa2 + Pb2, \quad \text{Equation (e)}$$

(6) the fourth control unit regards the sum ($Pa3$) of the integer part ($Pa1$) and the integer part ($Pa2$) as the control amount of the fourth parameter using Equation (f), and controls the fourth updating process unit based on a value of the integral sum ($Pa$)

$$Pa1 + Pa2 = Pa3, \text{ and} \quad \text{Equation (f)}$$

(7) the fourth storage unit stores the decimal part ($Pb2$) as the value ($Py$).

* * * * *